(12) United States Patent
Hsu et al.

(10) Patent No.: US 12,422,470 B2
(45) Date of Patent: Sep. 23, 2025

(54) SEMICONDUCTOR PACKAGES WITH THROUGH VIA STRUCTURES AND METHODS FOR TESTING THE SAME

(71) Applicant: Taiwan Semiconductor Manufacturing Company, Ltd., Hsinchu (TW)

(72) Inventors: Ying-Chih Hsu, Hsinchu (TW); Jui-Cheng Huang, Hsinchu (TW); Mu Wei Lee, Hsinchu (TW); Wei-Tao Shaw, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 221 days.

(21) Appl. No.: 18/479,462

(22) Filed: Oct. 2, 2023

(65) Prior Publication Data
US 2025/0110172 A1  Apr. 3, 2025

(51) Int. Cl.
*G01R 31/28* (2006.01)
(52) U.S. Cl.
CPC ..... *G01R 31/2853* (2013.01); *G01R 31/2843* (2013.01); *G01R 31/2884* (2013.01)
(58) Field of Classification Search
CPC ............ G01R 31/2853; G01R 31/2843; G01R 31/2884
USPC .................... 324/764.01, 537, 500
See application file for complete search history.

(56) References Cited

U.S. PATENT DOCUMENTS

| | | | |
|---|---|---|---|
| 2013/0038343 A1* | 2/2013 | Tu | G01R 31/40 |
| | | | 324/754.03 |
| 2020/0111734 A1 | 4/2020 | Lin et al. | |
| 2021/0097015 A1 | 4/2021 | Das Sharma et al. | |
| 2021/0190854 A1* | 6/2021 | Oh | G01R 31/2896 |
| 2022/0014198 A1 | 1/2022 | Lee et al. | |
| 2023/0073807 A1 | 3/2023 | Das Sharma et al. | |
| 2025/0087539 A1* | 3/2025 | Whetsel | H01L 25/0657 |

FOREIGN PATENT DOCUMENTS

| | | |
|---|---|---|
| TW | 202129879 A | 8/2021 |
| TW | 202145463 A | 12/2021 |
| TW | 202213653 A | 4/2022 |
| TW | 202224035 A | 6/2022 |
| TW | 202236808 A | 9/2022 |
| TW | 202312387 A | 3/2023 |

OTHER PUBLICATIONS

Office Action issued in connection with Taiwan Appl. No. 113113171 dated Jan. 8, 2025.

* cited by examiner

*Primary Examiner* — Giovanni Astacio-Oquendo
(74) *Attorney, Agent, or Firm* — FOLEY & LARDNER LLP

(57) ABSTRACT

A semiconductor package includes an array of through-substrate-via (TSV) structures comprising a number (O) of TSV structures, wherein the array comprises a number (M) of active TSV structures; a number (N) of contact structures, the contact structures comprising a plurality of pairs configured to receive an input test signal and provide an output test signal, respectively; and a plurality of binary-tree branches, each of the plurality of binary-tree branches electrically coupling a first one of the active TSV structures to a second one of the active TSV structures and a third one of the active TSV structures.

20 Claims, 13 Drawing Sheets

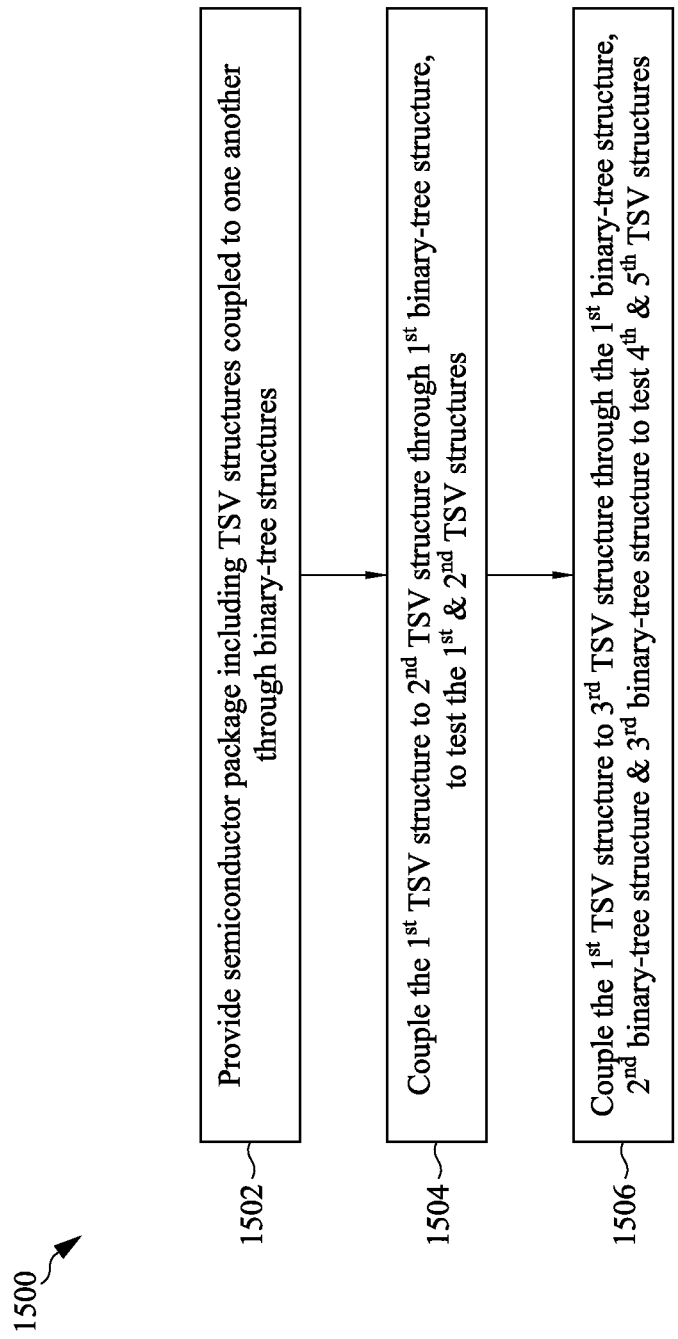

SEMICONDUCTOR PACKAGES WITH THROUGH VIA STRUCTURES AND METHODS FOR TESTING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more advanced packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is an example flow chart of a method for testing TSV structures of a semiconductor package, in accordance with some embodiments.

DETAILED DESCRIPTION

Figure 1:
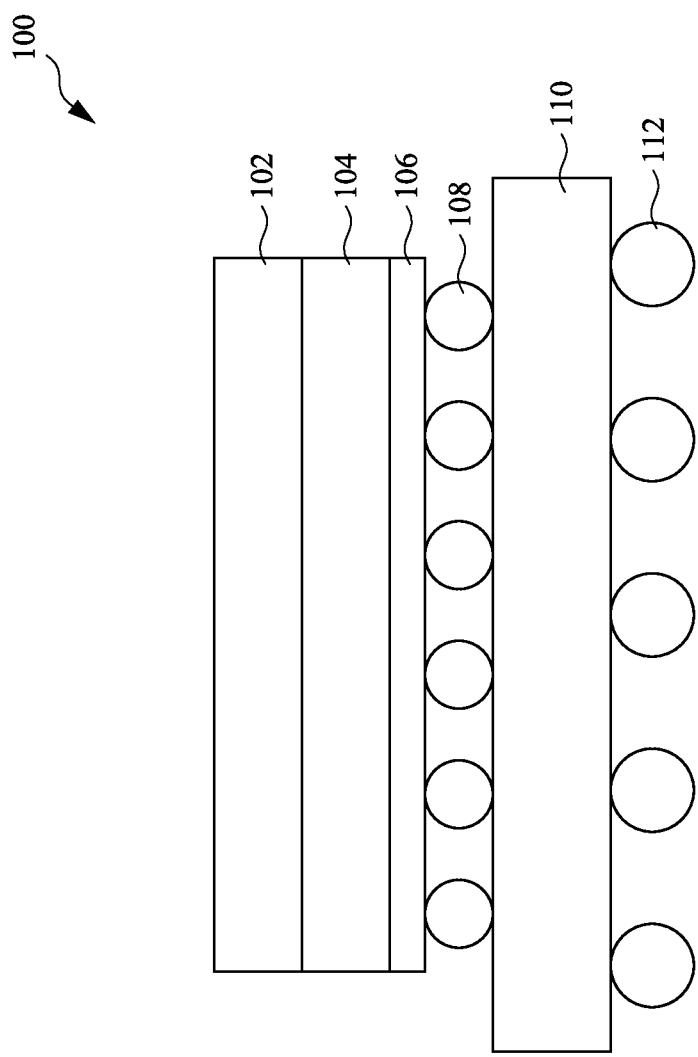
FIG. 1 illustrates a cross-sectional view of an example semiconductor package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers (substrates), forming respective semiconductor dies. Two or more semiconductor wafers (or dies) may be arranged on top of one another to further reduce the form factor of the semiconductor device.

Two semiconductor wafers or dies (e.g., a bottom die and a top die) may be bonded together through suitable bonding techniques such as, for example, hybrid bonding, microbumps, direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor dies based on a number of through via structures (e.g., through-silicon-vias, through-substrate-vias, or the like).

Such through via structures are generally utilized to deliver supply voltages and/or signals between the bottom die and the top die. When one or more of the through via structures are malfunctional, the whole semiconductor package may not function as desired. In the existing technologies, these through via structures are generally tested based on a daisy chain scheme. For example, different through via structures are coupled to one another in series. An input test signal is provided at one end of the chain, with an output test signal generated at the other end of the chain for determining if any of the through via structures is malfunctional (e.g., open, short, etc.). Such test techniques typically lack ability to identify local malfunction or require additional circuit components (e.g., decoders) formed. Thus, the existing semiconductor package, or techniques to test its through via structures, has not been entirely satisfactory in certain aspects.

The present disclosure provides various embodiments of a semiconductor device or package that includes a number of through-silicon/substrate-via (TSV) structures electrically coupled to one another through a number of branch structures. In various embodiments, each of the branch structures is formed as a binary-tree branch that consists of one root portion and at least two leaf portions. As such, each branch structure is configured to couple a first TSV structure, a second TSV structure, and a third TSV structure to one another. For example, the first TSV structure (sometimes referred to as a root node) is connected to the second TSV structure (sometimes referred to as a first leaf node) through the root portion and one of the leaf portions, and connected to the third TSV structure (sometimes referred to as a second leaf node) through the root portion and the other of the leaf portions. With the TSV structures coupled to one another through these branch structures, various more efficient test techniques to identify local malfunction are enabled. For example, through conducting different levels of the branch structures, each of the TSV structures can be locally tested to determine whether it is malfunctional. Consequently, the disclosed semiconductor package can have each of its TSV structures functioning, as desired.

FIG. 1 illustrates a cross-sectional view of a semiconductor package (or device) 100, in accordance with various embodiments. In one aspect, the semiconductor package 100 may sometimes be referred to as a three-dimensional integrated circuit (3DIC) with two or more layers of semiconductor/conductor devices (sometimes referred to as "stage layers") stacked on top of one another. It should be understood that the semiconductor package 100 is simplified for illustrative purposes, and thus, the arrangement of components of the semiconductor package 100 can be configured in various other manners and/or the semiconductor package 100 can include any of other components while remaining within the scope of the present disclosure.

For example, the semiconductor package 100 includes a first (e.g., top) semiconductor die 102 and a second (e.g., bottom) semiconductor die 104 stacked on top of one another. The top and bottom semiconductor dies 102 and 104 may be (e.g., electrically) bonded to each other through suitable bonding techniques such as, for example, hybrid bonding, microbumps, direct bonding, chemically activated bonding, plasma activated bonding, anodic bonding, eutectic bonding, glass frit bonding, adhesive bonding, thermocompressive bonding, reactive bonding and/or the like.

In one embodiment, the top semiconductor die 102 may include multiple active circuits/devices/loads such as, for example, a system-on-chip (SoC) device, a high-bandwidth memory (HBM) device, or the like, while the bottom semiconductor die 104 may include one or more passive circuits/devices/loads such as, for example, an integrated passive device, an integrated voltage regulator, or the like. In another embodiment, the top semiconductor die 102 may include both active and passive circuits/devices/loads, and the bottom semiconductor die 104 may also include both active and passive circuits/devices/loads. In yet another embodiment, the top semiconductor die 102 may include passive circuits/devices/loads, while the bottom semiconductor die 104 may also include active circuits/devices/loads.

The semiconductor package 100 further includes a redistribution structure 106 connected to the bottom die 104. It should be appreciated that the illustration of the redistribution structure 106 in FIG. 1 (and the following figures) is schematic. The redistribution structure 106 may include a number of redistribution lines (RDLs), such as metal traces (or metal lines), and vias underlying and connected to the metal traces, which are sometimes referred to as RDL routes. Such RDL routes may not be shown in the following figures.

The RDLs may be formed through plating processes, wherein each of the RDLs includes a seed layer (not shown) and a plated metallic material over the seed layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the RDLs. The patterning forms openings through the photo resist to expose the seed layer. A conductive material is formed in the openings of the photo resist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet and/or dry etching. The remaining portions of the seed layer and conductive material form the RDLs of the redistribution structure 106.

The semiconductor package 100 further includes a number of bumps 108 (e.g., electrically) connecting the redistribution structure 106 to a package substrate 110. The bumps 108 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 108 are C4 bumps. The bumps 108 may be formed by a sputtering, printing, electro plating, electroless plating, CVD, or the like. The bumps 108 may be solder free and have substantially vertical sidewalls. In some embodiments, a metal cap layer (not shown) is formed on the top of the bumps 108. The metal cap layer may include nickel, tin, tin-lead, gold, silver, palladium, indium, nickel-palladium-gold, nickel-gold, the like, or a combination thereof and may be formed by a plating process.

The package substrate 110 may be, e.g., a printed circuit board (PCB) or the like, and may be connected to the intermediate package (e.g., bonded top semiconductor die 102 and bottom semiconductor die 104 together with the redistribution structure 106) using the bumps 108. The package substrate 110 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 110 may be a SOI substrate. Generally, an SOI substrate includes a layer of a semiconductor material such as epitaxial silicon, germanium, silicon germanium, SOI, SGOI, or combinations thereof. The package substrate 110 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 110.

The package substrate 110 may include metallization layers and vias, and bond pads over the metallization layers and vias. The metallization layers are designed to connect the various devices to form functional circuitry, which are sometimes referred to as package routes. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). Such package routes may not be shown in the following figures.

The semiconductor package 100 further includes a number of contact/connector structures 112 disposed on a side of the package substrate 110 opposite to its side facing the redistribution structure 106, as shown in FIG. 1. The contact structures 112 may be formed from a conductive material such as solder, copper, aluminum, gold, nickel, silver, palladium, tin, the like, or a combination thereof. In some embodiments, the contact structures 112 are formed by initially forming a layer of solder through methods such as evaporation, electroplating, printing, solder transfer, ball placement, or the like. Once a layer of solder has been formed on the structure, a reflow may be performed in order to shape the contact structures 112 into desired bump shapes. Such contact structures 112 can operatively serve as package pins (or pads) of the semiconductor package 100, for example, configured to receive one or more input test signals or provide one or more output test signals, in accordance with some embodiments.

At least one of the top semiconductor die 102 or the bottom semiconductor die 104 can include a number of TSV structures to couple (e.g., bond) the top semiconductor die 102 to the bottom semiconductor die 104. In one example, the top semiconductor die 102 and the bottom semiconductor die 104 may be bonded to each other in a face-to-face (F2F) scheme. As such, the top semiconductor die 102 and the bottom semiconductor die 104 may have their top back-end-of-line (BEOL) metallization layers facing each other. The bottom semiconductor die 104 may have a number of TSV structures extending therethrough to connect to the redistribution structure 106. In another example, the top semiconductor die 102 and the bottom semiconductor die 104 may be bonded to each other in a face-to-back (F2B) scheme. As such, the bottom semiconductor die 104 may have its top BEOL metallization layer facing the backside of a substrate of the top semiconductor die 102. The top semiconductor die 102 may have a number of TSV structures extending therethrough to connect to the bottom semiconductor die 104.

Further, each of the stage layers included in the semiconductor package 100 (e.g., top semiconductor die 102, bottom semiconductor die 104, a combination of the semiconductor dies 102-104, etc.) may have a first side and a second side. In accordance with various embodiments of the present disclosure, conductive structures disposed on the first side may be spaced apart from one another with a larger distance (e.g., a larger pitch), while conductive structures disposed on the second side may be spaced apart from one another with a smaller distance (e.g., a smaller pitch). Further, the conductive structures on the first side may be configured to receive one or more input test signals and provide one or more output test signals. Such an input test signal may propagate from a conductive structure disposed on the first side, through one or more TSV structures of the stage layer, and to another conductive structure on the first side as an output test signal.

Figure 4:
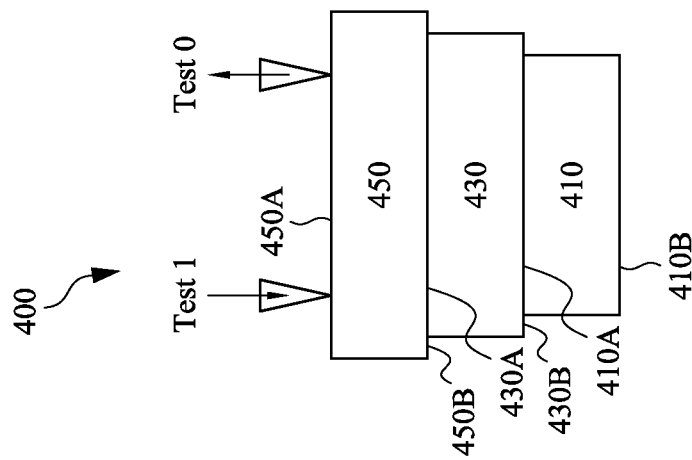
FIGS. 2, 3, and 4 illustrate cross-sectional views of example semiconductor packages, each of which includes one or more stage layers, in accordance with some embodiments.
Figure 3:
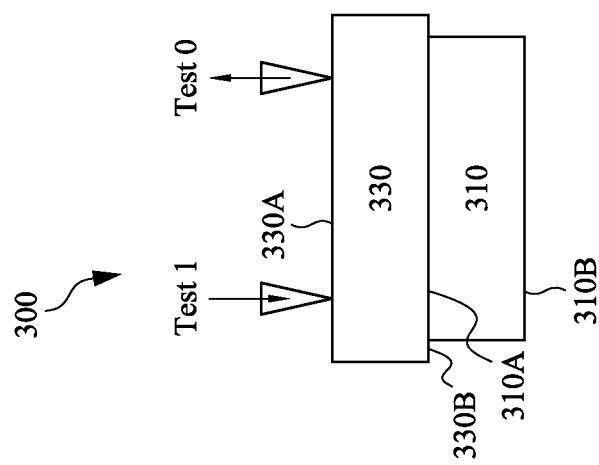
Figure 2:
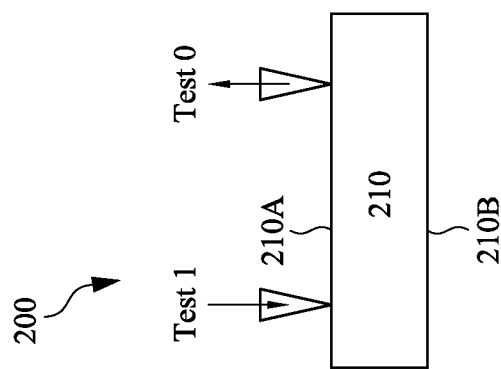

FIGS. 2, 3, and 4 illustrate cross-sectional views of semiconductor packages 200, 300, and 400, respectively, in accordance with various embodiments. Each of the semiconductor packages 200 to 500 includes a number of stage layer(s), and each of the stage layers has a first side with a larger pitch of conductive structures and a second side with a smaller pitch of conductive structures. In some embodiments, the stage layer, as disclosed herein, can include one or more semiconductor dies, one or more redistribution structures, one or more package substrates, or one or more combinations thereof. However, for clarity, the stage layer is shown as a single layer in the following discussion.

For example in FIG. 2, the semiconductor package 200 includes a stage layer 210 with a first side 210A and a second side 210B. Conductive structures formed on the first side 210A, configured to receive and provide test signals, may have a larger pitch, when compared to conductive structures formed on the second side 210B that have a smaller pitch. In FIG. 3, the semiconductor package 300 includes a first stage layer 310 with a first side 310A and a second side 310B, and a second stage layer 330 with a first side 330A and a second side 330B. Conductive structures formed on the first side 330A, configured to receive and provide test signals, may have a larger pitch, when compared to conductive structures formed on the second side 330B that have a smaller pitch. Further, conductive structures formed on the first side 310A, facing the stage layer 330, may have a larger pitch, when compared to conductive structures of the second side 310B that have a smaller pitch. In FIG. 4, the semiconductor package 400 includes a first stage layer 410 with a first side 410A and a second side 410B, a second stage layer 430 with a first side 430A and a second side 430B, and a third stage layer 450 with a first side 450A and a second side 450B. Conductive structures formed on the first side 430A, configured to receive and provide test signals, may have a larger pitch, when compared to conductive structures formed on the second side 450B that have a smaller pitch. Further, conductive structures formed on the first side 430A, facing the stage layer 450, may have a larger pitch, when compared to conductive structures of the second side 430B that have a smaller pitch, and conductive structures formed on the first side 410A, facing the stage layer 430, may have a larger pitch, when compared to conductive structures of the second side 410B that have a smaller pitch.

Figure 5:
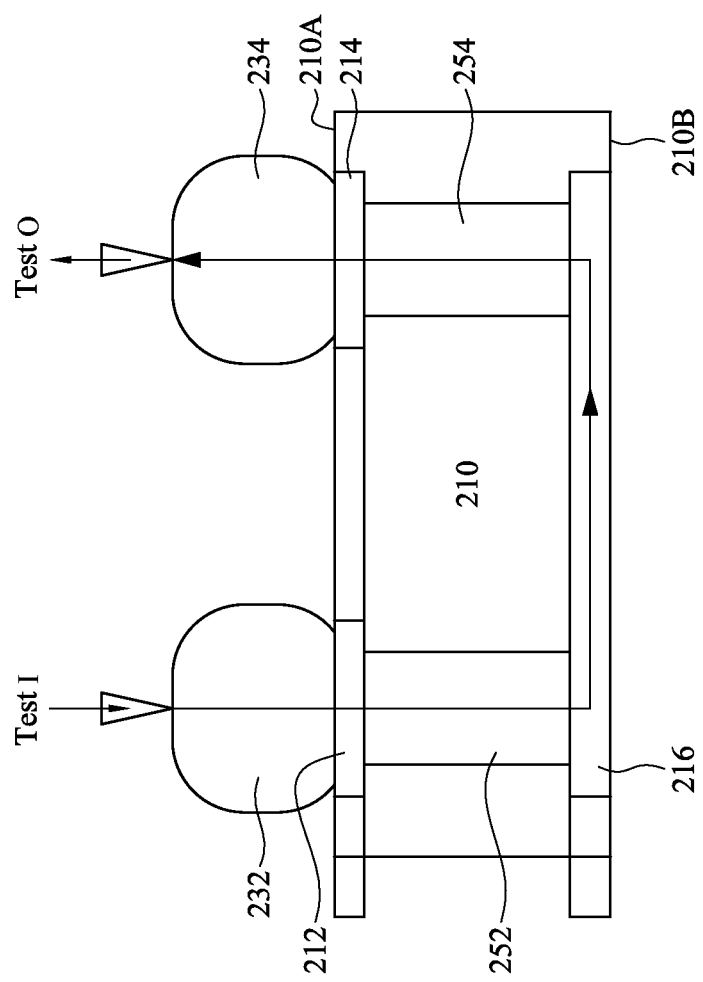
FIG. 5 illustrates a cross-sectional view of a stage layer, in accordance with some embodiments.

FIG. 5 further illustrates a cross-sectional view of the stage layer 210 (FIG. 2) that includes conductive structures 212 and 214 formed on the first side 210A, and a conductive structure 216 formed on the second side 210B, in accordance with some embodiments. The conductive structures 212 to 216 may each be configured as a lateral metal routing that is formed as a branch structure (e.g., a binary-tree branch), in some embodiments, which will be shown in FIG. 6. The stage layer 210 further includes TSV structures 252 and 254 at least partially extending therethrough. As shown, an input test signal is received from a contact structure 232, through the conductive structure 212, the TSV structure 252, the conductive structure 216, the TSV structure 254, and the conductive structure 214, and outputted through a contact structure 234 as an output test signal. The contact structures 252 and 254 may each be implemented as a bump, in some embodiments.

Figure 6:
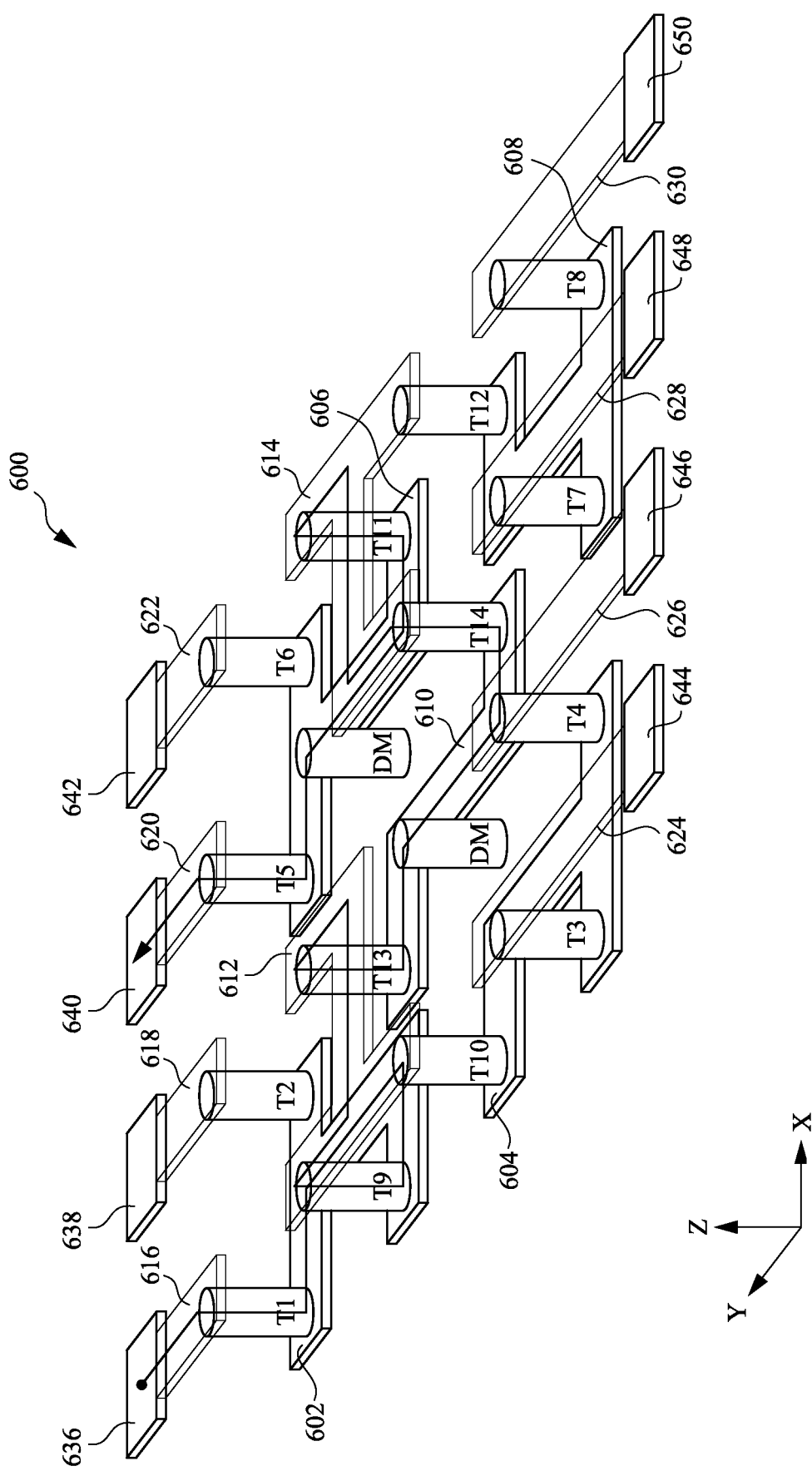
FIG. 6 illustrates a perspective view of a stage layer, in accordance with some embodiments.

FIG. 6 illustrates a perspective view of a stage layer 600 that includes a number of TSV structures coupled to one another through a number of branch structures, in accordance with some embodiments. The stage layer 600 may be an implementation of any of the stage layers discussed above, e.g., having a first side with a larger pitch and a second side with a smaller pitch. It should be understood that the stage layer 600 is illustrated as a non-limiting example, and thus, the arrangement of components of the stage layer 600 can be configured in various other manners and/or the stage layer 600 can include any of other components while remaining within the scope of the present disclosure.

As shown, the stage layer 600 includes a number (O) of TSV structures, e.g., a number (M) of active TSV structures T1, T2, T3, T4, T5, T6, T7, T8, T9, T10, T11, and T12, and a number (P) of dummy TSV structures, DMs. In the present disclosure, the active TSV structure may refer to a TSV structure that is operatively (e.g., electrically) coupled to a functional component (e.g., a metal routing, another stage layer, etc.), and the dummy TSV structure may refer to a TSV structure that is not operatively (e.g., electrically) coupled to any functional component (e.g., a metal routing, another stage layer, etc.). Although a total of sixteen TSV structures are shown, it should be understood that the stage layer 600 can include any number of TSV structures while remaining within the scope of the present disclosure. In some embodiments, active and dummy TSV structures of the disclosed stage layer are formed as an array, e.g., arranged over a number of columns and a number of rows with each of the TSV structures disposed at an intersection of a corresponding column and a corresponding row.

For example in FIG. 6, the TSV structures T1, T2, T5, and T6 are disposed along a first row, and are respectively disposed in a first column, second column, third column, and fourth column; the TSV structures T9, T12, one of the DMs, and T11 are disposed along a second row, and are respectively disposed in the first column, second column, third column, and fourth column; the TSV structures T10, the other of the DMs, T14, and T12 are disposed along a third row, and are respectively disposed in the first column, second column, third column, and fourth column; and the TSV structures T3, T4, T7, and T8 are disposed along a fourth row, and are respectively disposed in the first column, second column, third column, and fourth column.

The stage layer 600 includes a number of conductive structures (or metal routings) disposed on opposite sides of the stage layer 600. In some embodiments, some of the conductive structures are each formed as a branch structure (e.g., a binary-tree branch) to electrically connect one of the TSV structures (e.g., as a root node) to other two of the TSV structures (e.g., as two leaf nodes). For example in FIG. 6, the stage layer 600 includes branch structures 602, 604, 606, 608, 612, and 614. The branch structure 602 connects the TSV structure T9 to the TSV structures T1 and T2; the branch structure 604 connects the TSV structure T10 to the TSV structures T3 and T4; the branch structure 606 connects the TSV structure T11 to the TSV structures T5 and T6; the branch structure 608 connects the TSV structure T12 to the TSV structures T7 and T8; the branch structure 612 connects the TSV structure T13 to the TSV structures T9 and T10; and the branch structure 614 connects the TSV structure T14 to the TSV structures T11 and T12. In some embodiments, the TSV structures T13 and T14 may be connected to each other through a conductive structure 610.

The stage layer 600 further includes conductive structures 616, 618, 620, 622, 624, 626, 628, and 630 configured to connect the TSV structures T1, T2, T5, T6, T3, T4, T7, and T8 to a number (N) of contact structures 636, 638, 640, 642, 644, 646, 648, and 650, respectively. Such contact structures 636 to 650 may each be formed as a pin or pad that receives or provides a test signal. In some embodiments, the branch structures 612 to 614 and the conductive structures 616 to 630, that are formed on the same side as the pads 636 to 650 (e.g., the first side of the stage layer 600 as discussed with respect to FIG. 5), may have a pitch larger than the branch structures 602 to 608, that are formed on the opposite side to the pads 636 to 650 (e.g., the second side of the stage layer 600 as discussed with respect to FIG. 5). In other words, neighboring ones of the branch structures 612 to 614 may be spaced from each other with a first distance and neighboring ones of the branch structures 602 to 608 may be spaced from each other with a second distance, where the first distance is greater than the second distance.

Figure 7:
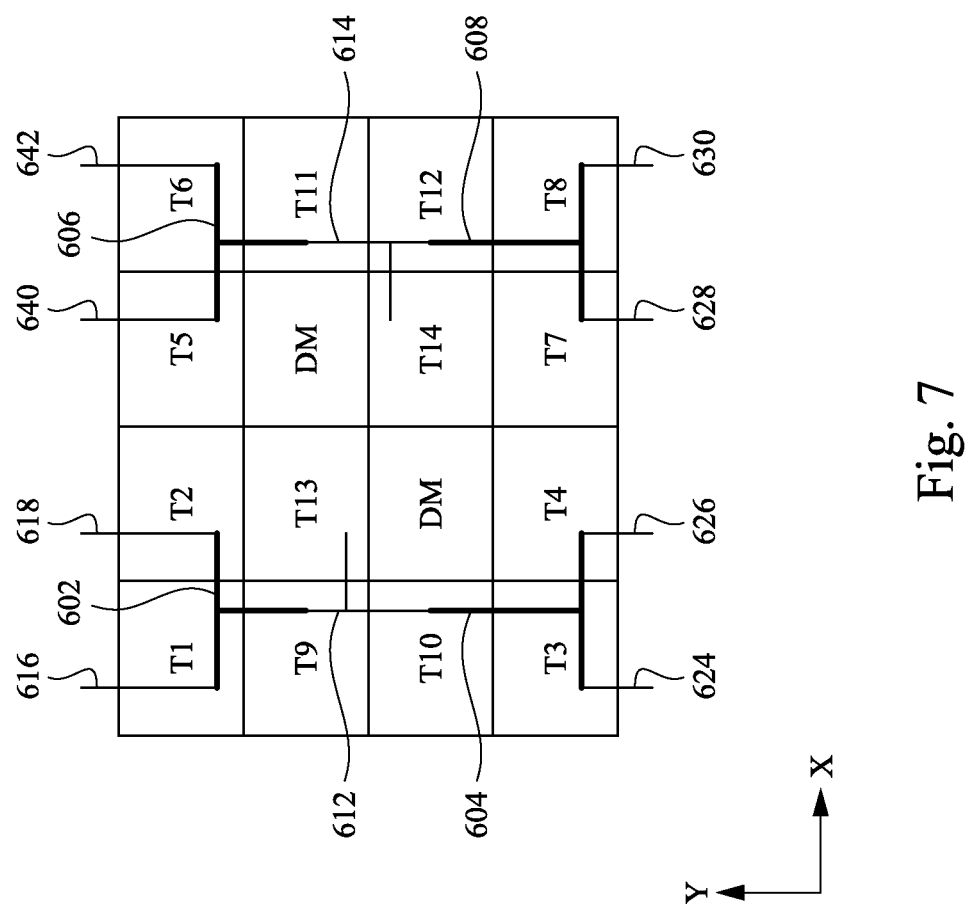
FIG. 7 illustrates a schematic map of TSV structures of a stage layer, in accordance with some embodiments.

FIG. 7 illustrates a schematic map equivalently illustrating the connections among the TSV structures T1 to T14, and the branch structures 602 to 608 and 612 to 614. Through such connections (and the arrangement of the TSV structures T1 to T14), the TSV structures T1 to T14 can be tested based on a binary-tree scheme, which is further illustrated in FIG. 8. As shown, a binary tree 800 illustrating operational connections among the TSV structures T1 to T14 is shown. Specifically, the branch structure 602 has a root portion and two leaf portions, in which the root portion connects the TSV structure T9 to the TSV structure T1 through one of the leaf portions and to the TSV structure T2 through the other of the leaf portions; the branch structure 604 has a root portion and two leaf portions, in which the root portion connects the TSV structure T10 to the TSV structure T3 through one of the leaf portions and to the TSV structure T4 through the other of the leaf portions; the branch structure 606 has a root portion and two leaf portions, in which the root portion connects the TSV structure T11 to the TSV structure T5 through one of the leaf portions and to the TSV structure T6 through the other of the leaf portions; the branch structure 608 has a root portion and two leaf portions, in which the root portion connects the TSV structure T12 to the TSV structure T7 through one of the leaf portions and to the TSV structure T8 through the other of the leaf portions; the branch structure 612 has a root portion and two leaf portions, in which the root portion connects the TSV structure T13 to the TSV structure T9 through one of the leaf portions and to the TSV structure T10 through the other of the leaf portions; the branch structure 614 has a root portion and two leaf portions, in which the root portion connects the TSV structure T14 to the TSV structure T11 through one of the leaf portions and to the TSV structure T12 through the other of the leaf portions; and the TSV structures T13 and T14 are connected to each other through the conductive structure 610.

Figure 8:
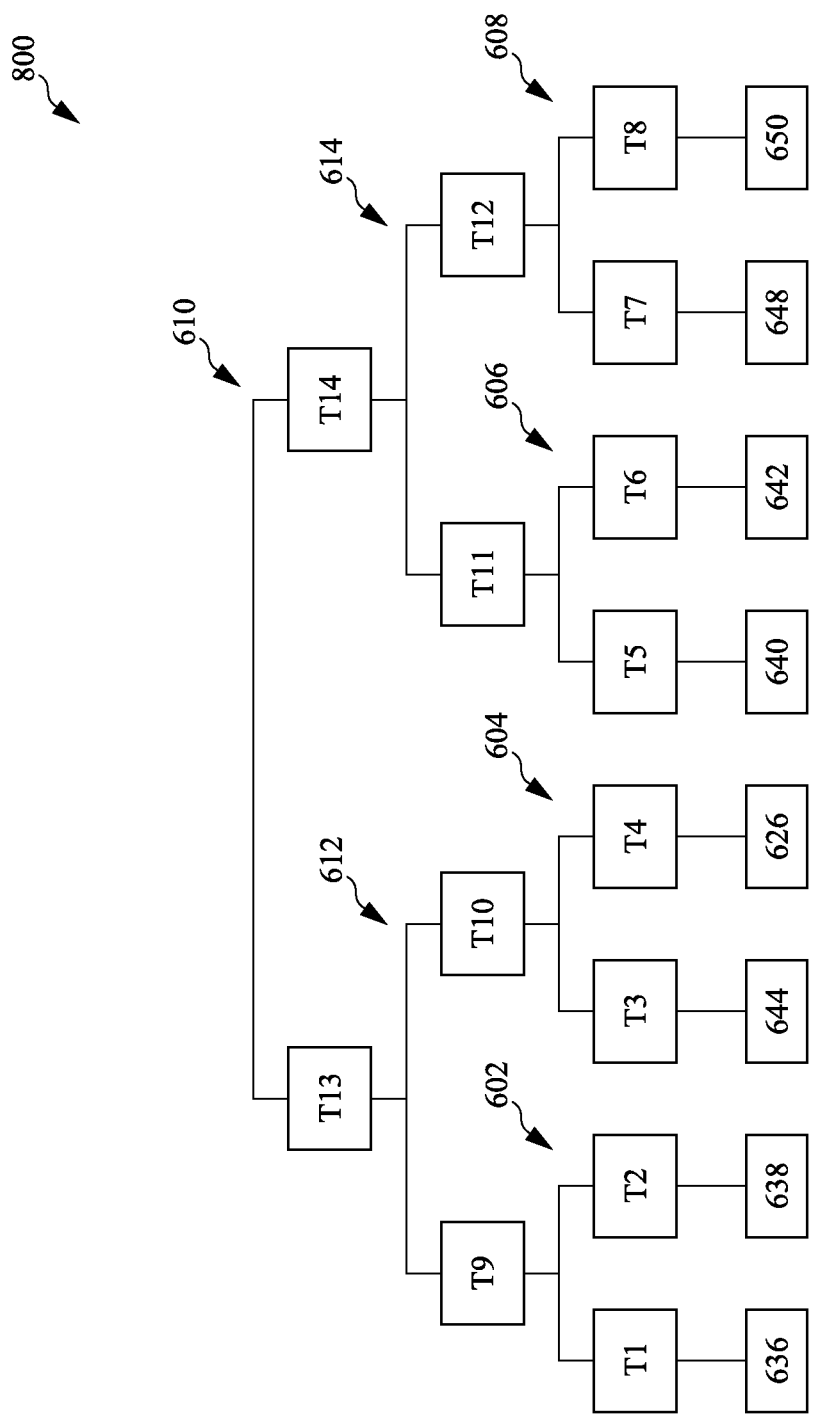
FIG. 8 illustrates a binary tree of TSV structures of a stage layer, in accordance with some embodiments.
Figure 9:
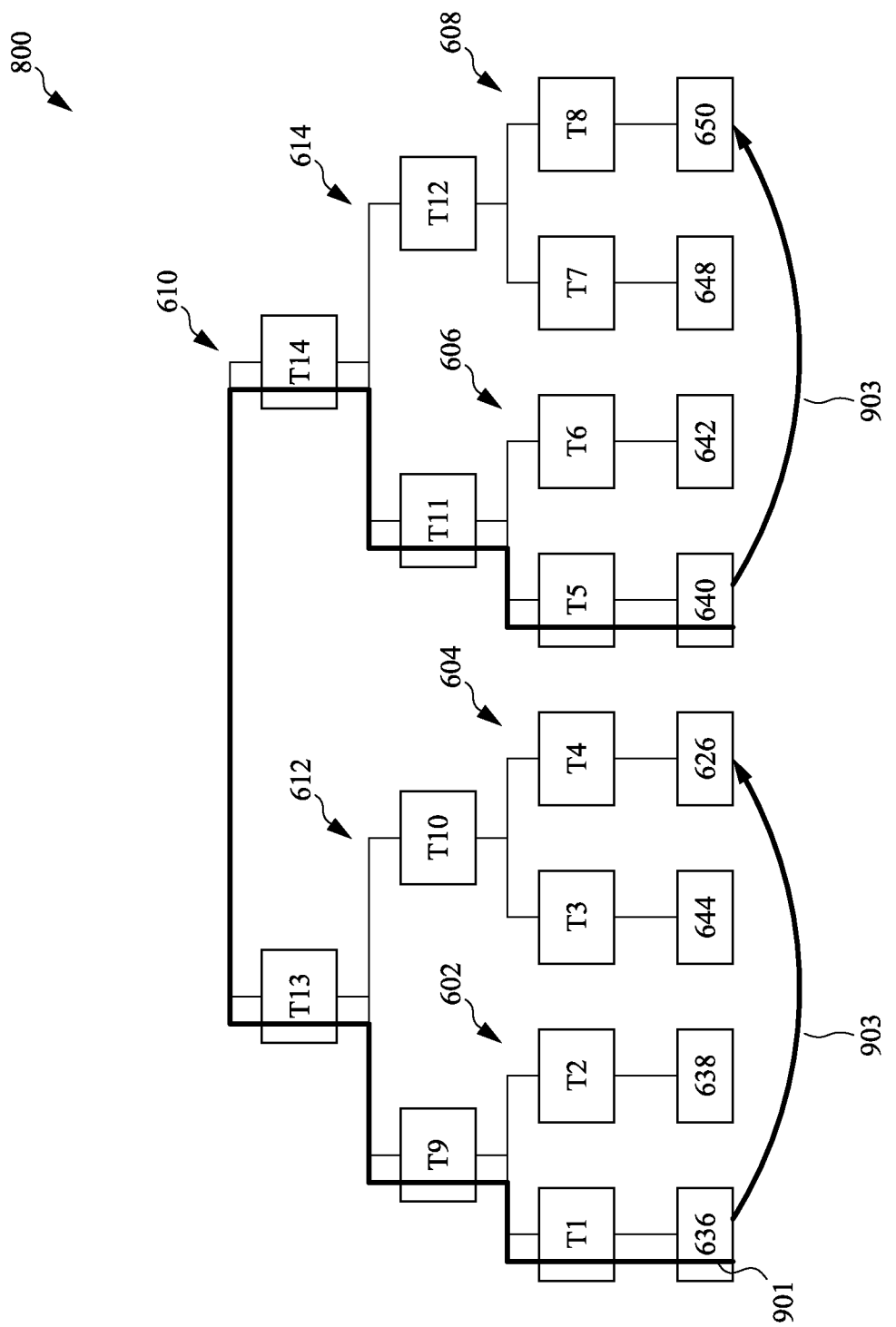
FIG. 9 schematically illustrates a technique to test TSV structures of a stage layer that are formed as a binary tree, in accordance with some embodiments.

Based on the binary tree 800 shown in FIG. 8, the TSV structures T1 to T14 can be tested through various techniques that are based on the binary-tree scheme. For example, FIG. 9 illustrates a first technique; and FIGS. 10, 11, and 12 collectively illustrate a second technique. In some embodiments, the first technique illustrated in FIG. 9 may correspond to minimum required testing steps, and the second technique illustrated in FIGS. 10-12 may correspond to maximum required testing steps, each of which will be discussed in further detail below.

Referring first to FIG. 9, a first step may involve providing an input test signal at the pad 636, conducting through the TSV structure T1, one of the leaf portions and the root portion of the branch structure 602, the TSV structure T9, one of the leaf portions and the root portion of the branch structure 612, the TSV structure T13, the conductive structure 610, the TSV structure T14, the root portion and one of the leaf portions of the branch structure 614, the TSV structure T11, the root portion and one of the leaf portions of the branch structure 606, and the TSV structure T5, and receiving an output test signal at the pad 640, which is indicated as symbolic path 901. Alternatively stated, the path 901 may start from a bottommost level of the binary tree 800, through one or more middle levels of the binary tree 800, and to a topmost level of the binary tree 800, and return from the topmost level to the bottommost level. The received output test signal may be compared with the input test signal to determine whether one or more of the TSV structures along the path 901 (e.g., TSV structures T1, T9, T13, T14, T11, and T5) are malfunctional. For example, the input test signal may be provided at logic high. Assuming all the TSV structures T1, T9, T13, T14, T11, and T5 are functional, the output test signal should also be at logic high. In certain cases where the output test signal is at logic low, it may be determined that one or more of the TSV structures T1, T9, T13, T14, T11, and T5 are malfunctional.

Following the same principle, a second step, a third step, and a fourth step (following symbolic arrow 903) may be performed to check the other TSV structures. For example, the second step may involve providing an input test signal at the pad 638, conducting through the TSV structure T2, the other of the leaf portions and the root portion of the branch structure 602, the TSV structure T9, one of the leaf portions and the root portion of the branch structure 612, the TSV structure T13, the conductive structure 610, the TSV structure T14, the root portion and one of the leaf portions of the branch structure 614, the TSV structure T11, the root portion and the other of the leaf portions of the branch structure 606, and the TSV structure T6, and receiving an output test signal at the pad 642. In some embodiments, a total of four steps may be performed in the technique illustrated in FIG. 9.

Figure 10:
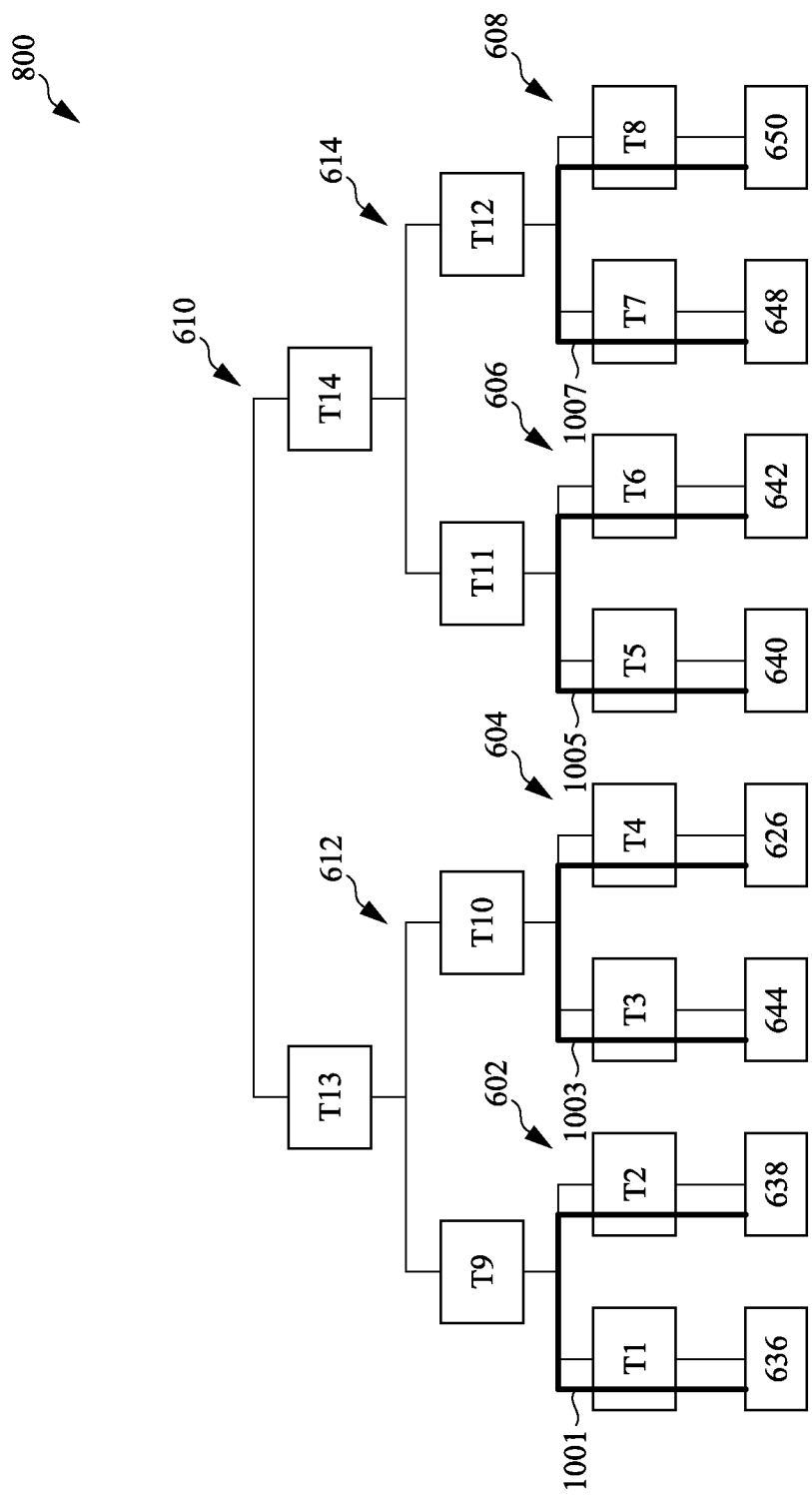
FIGS. 10, 11, and 12 schematically illustrate another technique to test TSV structures of a stage layer that are formed as a binary tree, in accordance with some embodiments.

Referring next to FIG. 10, a plurality of first steps, indicated as symbolic paths 1001, 1003, 1005, and 1007, respectively, may be performed to test a bottommost level of the binary tree 800. Specifically, the path 1001 may involve providing an input test signal at the pad 636, conducting through the TSV structure T1, the leaf portions of the branch structure 602, and the TSV structure T2, and receiving an output test signal at the pad 638; the path 1003 may involve providing an input test signal at the pad 644, conducting through the TSV structure T3, the leaf portions of the branch structure 604, and the TSV structure T4, and receiving an output test signal at the pad 626; the path 1005 may involve providing an input test signal at the pad 640, conducting through the TSV structure T5, the leaf portions of the branch structure 606, and the TSV structure T6, and receiving an output test signal at the pad 642; and the path 1007 may involve providing an input test signal at the pad 648, conducting through the TSV structure T7, the leaf portions of the branch structure 608, and the TSV structure T8, and receiving an output test signal at the pad 650.

The input and output test signals in each of these first steps can be utilized to determine whether any of the TSV structures at the bottommost level is malfunctional. For example, the path 1001 can be utilized to determine whether at least one of the TSV structure T1 or T2 is malfunctional; the path 1003 can be utilized to determine whether at least one of the TSV structure T3 or T4 is malfunctional; the path 1005 can be utilized to determine whether at least one of the TSV structure T5 or T6 is malfunctional; and the path 1007 can be utilized to determine whether at least one of the TSV structure T7 or T8 is malfunctional. In some embodiments, a total of four first steps may be performed in the technique illustrated in FIG. 10.

Figure 11:
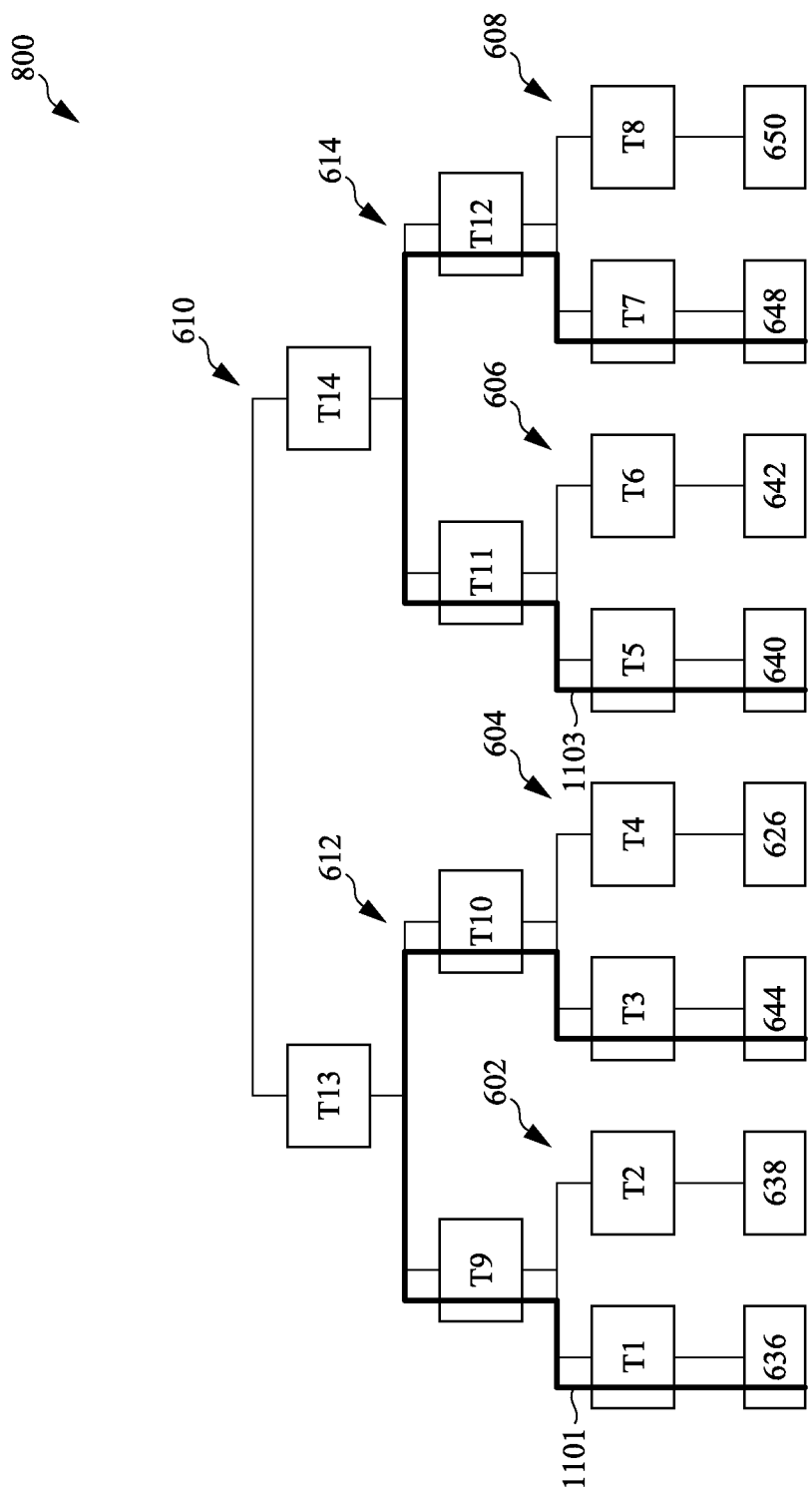

Referring next to FIG. 11, a plurality of second steps, indicated as symbolic paths 1101 and 1103, respectively, may be performed to test a middle level of the binary tree 800. Specifically, the path 1101 may involve providing an input test signal at the pad 636, conducting through the TSV structure T1, one of the leaf portions and the root portion of the branch structure 602, the TSV structure T9, the leaf portions of the branch structure 612, the TSV structure T10, the root portion and one of the leaf portions of the branch structure 604, the TSV structure T3, and receiving an output test signal at the pad 644; and the path 1103 may involve providing an input test signal at the pad 640, conducting through the TSV structure T5, one of the leaf portions and the root portion of the branch structure 606, the TSV structure T11, the leaf portions of the branch structure 614, the TSV structure T12, the root portion and one of the leaf portions of the branch structure 608, the TSV structure T7, and receiving an output test signal at the pad 648.

After the first steps are performed (e.g., to assure the TSV structures at the bottommost level are functional), the input and output test signals in each of these second steps can be utilized to determine whether any of the TSV structures at the middle level is malfunctional. For example, the path 1101 can be utilized to determine whether at least one of the TSV structure T9 or T10 is malfunctional; and the path 1103 can be utilized to determine whether at least one of the TSV structure T11 or T12 is malfunctional. In some embodiments, a total of two second steps may be performed in the technique illustrated in FIG. 11.

Figure 12:
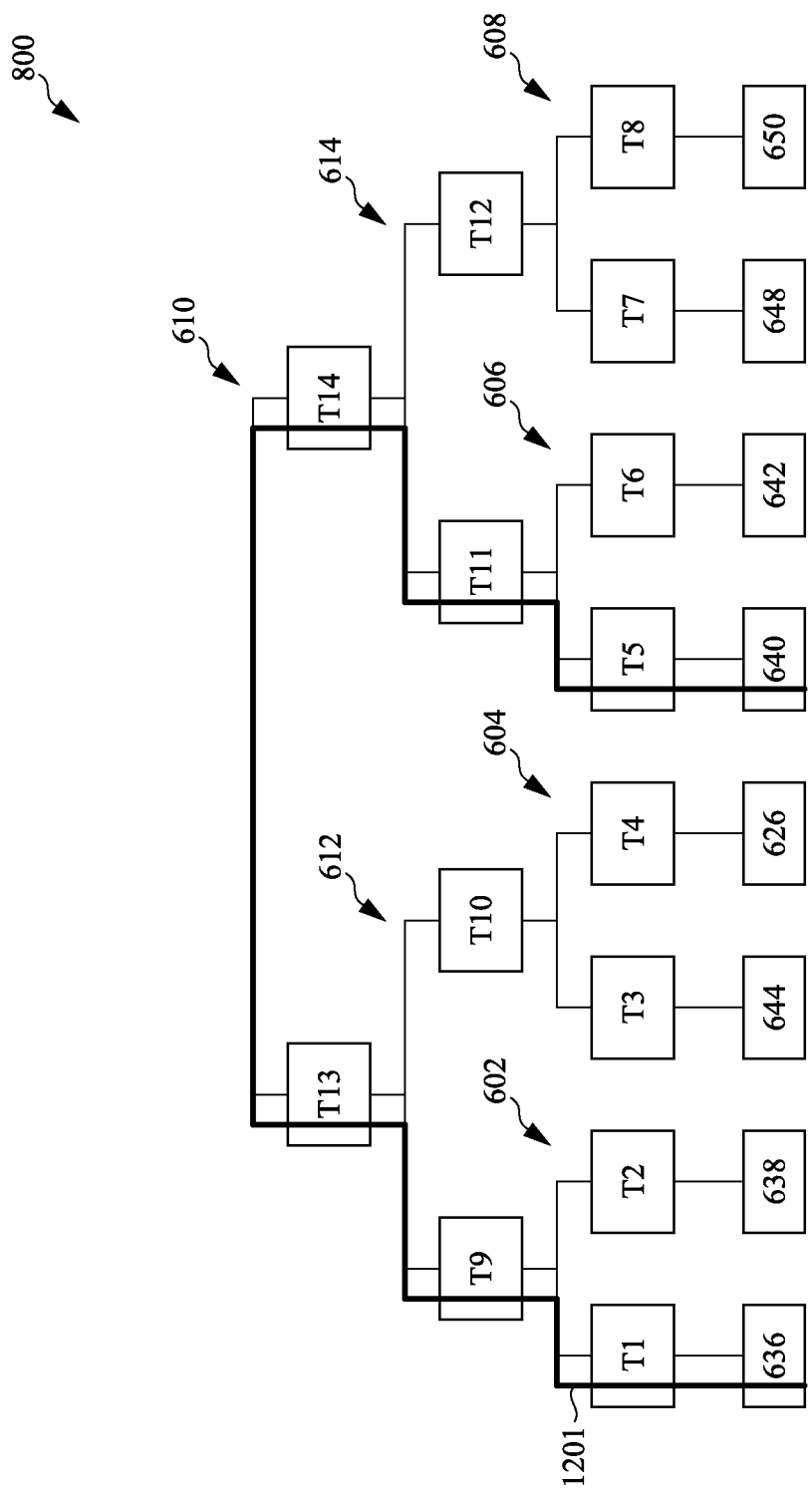

Referring next to FIG. 12, at least one third step, indicated as symbolic path 1201, may be performed to test a topmost level of the binary tree 800. Specifically, the path 1201 may involve providing an input test signal at the pad 636, conducting through the TSV structure T1, one of the leaf portions and the root portion of the branch structure 602, the TSV structure T9, one of the leaf portions and the root portion of the branch structure 612, the TSV structure T13, the conductive structure 610, the TSV structure T14, the root portion and one of the leaf portions of the branch structure 614, the TSV structure T11, the root portion and one of the leaf portions of the branch structure 606, the TSV structure T15, and receiving an output test signal at the pad 640.

After the second steps are performed (e.g., to assure the TSV structures at the middle level are functional), the input and output test signals in the third step can be utilized to determine whether any of the TSV structures at the topmost level is malfunctional. For example, the path 1201 can be utilized to determine whether at least one of the TSV structure T13 or T14 is malfunctional. In some embodiments, a total of one third step may be performed in the technique illustrated in FIG. 12. As such, a total of seven test steps may be performed in the technique illustrated in FIGS. 10-12.

The first and second techniques illustrated in FIGS. 9 and 10-12, respectively, are based on the example of stage layer 600 that includes an array of 16 (O)) TSV structures and 8 (N) contact structures, 2(P) of which serve as dummy ones and 14(M) of which serve as active ones. In some embodiments, the parameter N may be determined as O/2. Further, in some embodiments, the number of test steps in each of the first and second techniques may be associated with one or more of these parameters. For example, the test steps performed in the first technique (FIG. 9) may be determined as O/4. For another example, the test steps performed in the second technique (FIGS. 10-12) may be determined as O/2−1, in which the numbers of first, second, and third steps are determined as N/2, N/4, and N/8, respectively.

Table I below shows some further examples of stage layer that include other TSV array sizes.

TABLE I

| Array Size (O) | Active TSV (M) | Contact (N) | 1st Technique | 2nd Technique |
|---|---|---|---|---|
| 16 | 14 | 8 | 4 | 7 |
| 32 | 30 | 16 | 8 | 15 |

TABLE I-continued

| Array Size (O) | Active TSV (M) | Contact (N) | 1st Technique | 2nd Technique |
|---|---|---|---|---|
| 64 | 62 | 32 | 16 | 31 |
| 1024 | 1022 | 512 | 256 | 511 |

Figure 13:
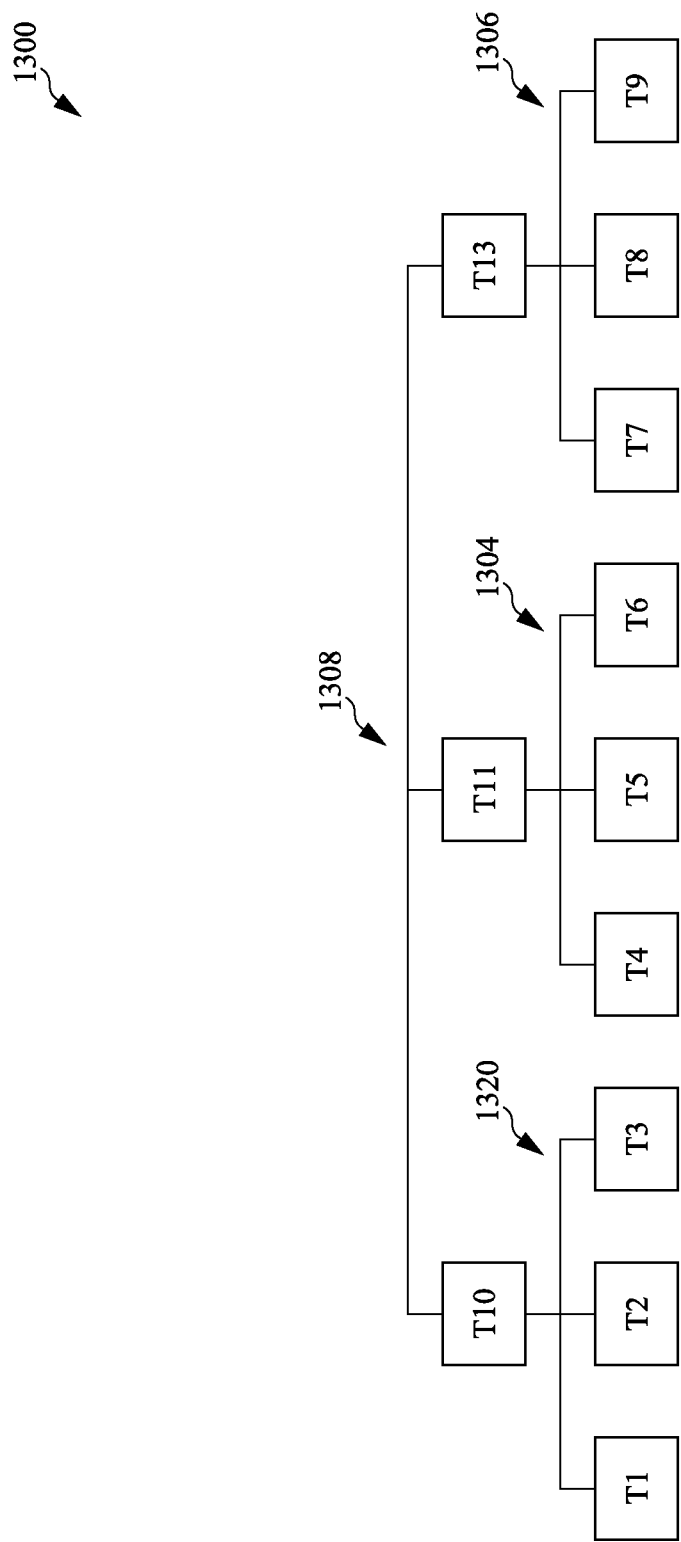
FIG. 13 illustrates another binary tree of TSV structures of a stage layer, in accordance with some embodiments.

FIG. 13 illustrates another example binary tree 1300 for operationally connecting the different TSV structures of a stage layer. As shown, the binary tree 1300 includes TSV structures T1 to T12, coupled to one another through branch structures 1302, 1304, 1306, and 1308. The branch structures 1302 to 1306 each have a root portion and three leaf portions. Specifically, the TSV structure T10 is coupled to the TSV structures T1 to T3 through the root portion and the three leaf portions of the branch structure 1302; the TSV structure T11 is coupled to the TSV structures T4 to T6 through the root portion and the three leaf portions of the branch structure 1304; and the TSV structure T12 is coupled to the TSV structures T7 to T9 through the root portion and the three leaf portions of the branch structure 1306.

Figure 14:
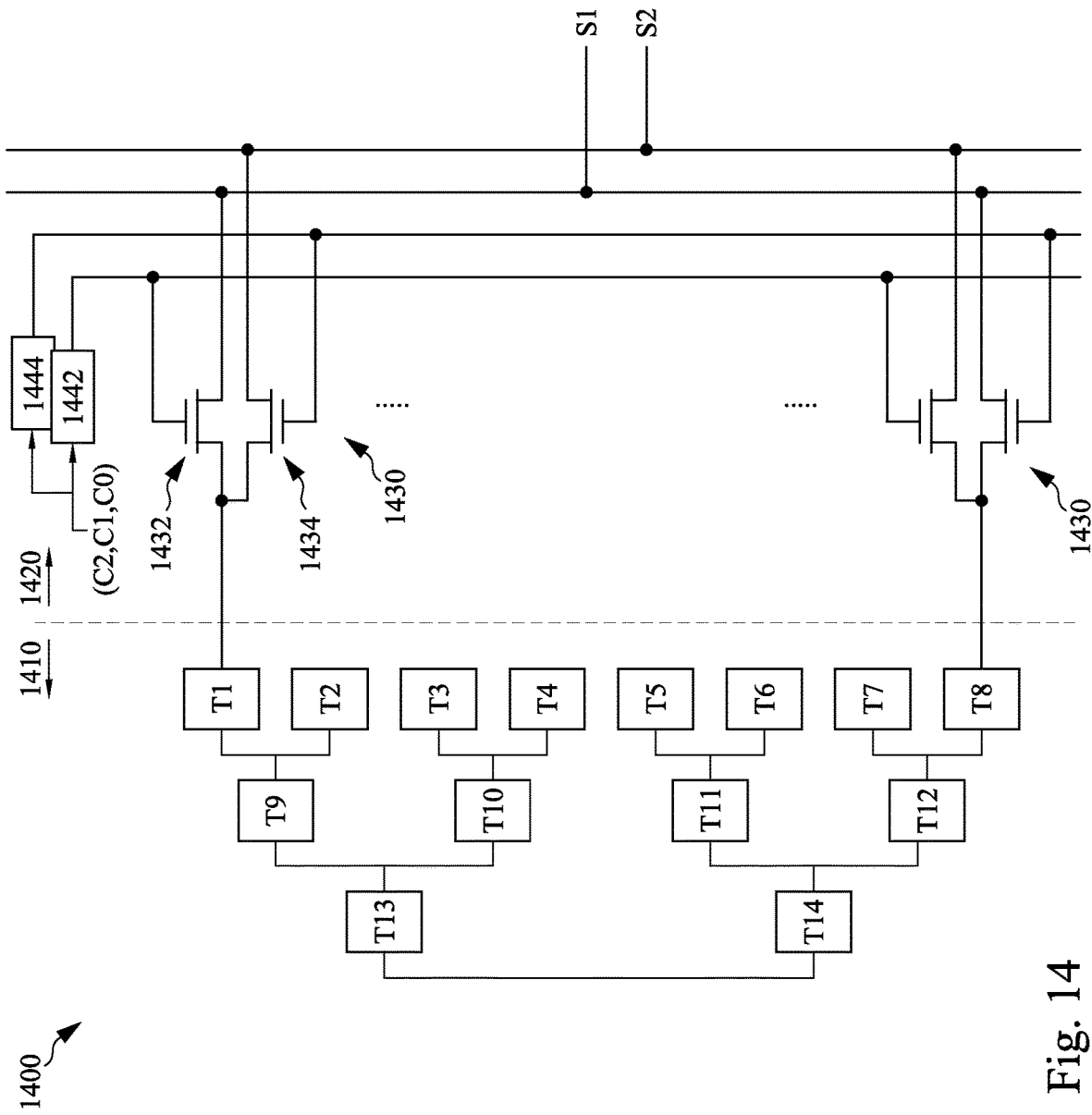
FIG. 14 illustrates a circuit diagram including TSV structures formed as a binary tree and a control circuit, in accordance with some embodiments.

FIG. 14 illustrates a schematic diagram of a circuit 1400 including a binary tree 1410 and a control circuit 1420, in accordance with some embodiments. The binary tree 1410 includes a number of TSV structures, and the control circuit 1420, operatively coupled to the binary tree 1410, is configured to test the TSV structures of the binary tree 1410. The binary tree 1410 is substantially similar to the above example binary tree 800 (FIG. 8), e.g., including sixteen TSV structures T1 to T14 operatively coupled to one another through branch structures. Thus, description of the binary tree 1410 is not repeated. It should be understood that the schematic diagram of FIG. 14 is simplified for illustrative purposes, and thus, the arrangement of components of the circuit 1400 can be configured in various other manners and/or the circuit 1400 can include any of other components while remaining within the scope of the present disclosure.

In some embodiments, the control circuit 1420 includes a number of switches 1430, a first input circuit 1442, and a second input circuit 1444. Each of the switches 1430 is coupled to a corresponding one of the TSV structures at the bottommost level of the binary tree 1410, e.g., T1, T2, T3, T4, T5, T6, T7, and T8. The switch 1430 is implemented as a transmission gate that includes two transistors, 1432 and 1434. Specifically, gates of the transistors 1432 and 1434 are coupled to the first input circuit 1442 and the second input circuit 1444, respectively; both drains of the transistors 1432 and 1434 are connected to the corresponding TSV structure; and sources of the transistors 1432 and 1434 are coupled to a first input/output terminal $S_1$ and a second input/output terminal $S_2$, respectively. The first and second input/output terminals $S_1$ and $S_2$ may each be implemented as a pad, a pin, or an otherwise contact structure, according to some embodiments.

The TSV structures T1 to T14 of the binary tree 1410 can be tested following the technique described with respect to FIGS. 10-12. To this end, the first input circuit 1442 and the second input circuit 1444 may both receive a control signal with three bits, ($C_2$, $C_1$, $C_0$), that has at least seven combinations. Each of the seven combinations may correspond to one of the test steps/paths, 1001, 1003, 1005, 1007, 1101, 1103, and 1201. As an overview, the switches 1430 corresponding to a neighboring pair of the bottommost TSV structures can be sequentially turned on or otherwise activated (paths 1001, 1003, 1005, and 1007), so as to allow one of the first input/output terminal $S_1$ or second input/output terminal $S_2$ to receive an input test signal and the other of the first input/output terminal $S_1$ or second input/output terminal $S_2$ to provide an output test signal. Next, the switches 1430 corresponding to every two of the bottommost TSV structures can be sequentially turned on or otherwise activated (paths 1101 and 1103), so as to allow one of the first input/output terminal $S_1$ or second input/output terminal $S_2$ to receive an input test signal and the other of the first input/output terminal $S_1$ or second input/output terminal $S_2$ to provide an output test signal. Next, the switches 1430 corresponding to every four of the bottommost TSV structures can be sequentially turned on or otherwise activated (path 1201), so as to allow one of the first input/output terminal $S_1$ or second input/output terminal $S_2$ to receive an input test signal and the other of the first input/output terminal $S_1$ or second input/output terminal $S_2$ to provide an output test signal.

Table II below summaries the correspondence between the control signal ($C_2$, $C_1$, $C_0$) and the switches 1430. Symbol "X" refers to the corresponding switch 1430 being turned on.

TABLE II

| $C_2$ | $C_1$ | $C_0$ | T8 | T7 | T6 | T5 | T4 | T3 | T2 | T1 |
|---|---|---|---|---|---|---|---|---|---|---|
| 0 | 0 | 0 |   |   |   |   |   |   | X | X |
| 0 | 0 | 1 |   |   |   |   | X | X |   |   |
| 0 | 1 | 0 |   |   | X | X |   |   |   |   |
| 0 | 1 | 1 | X | X |   |   |   |   |   |   |
| 1 | 0 | 0 |   |   |   |   | X |   |   | X |
| 1 | 0 | 1 |   | X |   | X |   |   |   |   |
| 1 | 1 | 0 |   |   |   | X |   |   |   | X |

FIG. 15 illustrates a flow chart of an example method 1500 for testing TSV structures of a semiconductor package, in accordance with some embodiments of the present disclosure. The TSV structures are electrically coupled to one another through a number of binary-tree structures, e.g., the binary tree 800 (FIGS. 8-12). Accordingly, the following discussion of the method 1500 may sometimes be referred to the binary tree 800 discussed with respect to FIGS. 8-12. It should be noted that the method 1500 is merely an example and is not intended to limit the present disclosure. As such, additional operations may be provided before, during, and after the method 1500 of FIG. 15, and that some other operations may only be briefly described herein.

The method 1500 starts with operation 1502 in which a semiconductor package including a number of active TSV structures coupled to one another through a number of binary-tree structures is provided. In some embodiments, each of the active TSV structures is physically coupled to two other ones of the active TSV structures through a corresponding one of the binary-tree structures. Using the binary tree 800 (FIG. 8) as a representative example, the (active) TSV structures T1 to T14 are coupled to one another through conductive structures 602 to 614, in which at least the conductive structures 602-608 and 612-614 are each formed as a binary-tree structure (shown in FIG. 6).

The method 1500 proceeds to operation 1504 in which a first one of the active TSV structures is electrically coupled to a second one of the active TSV structures through a first one of the binary-tree structures to test the first active TSV structure and the second active TSV structure. In some embodiments, operation 1504 may be performed multiple times to test each of the TSV structures at the bottommost level of the binary tree. Continuing with the above example, the TSV structure T1 (the first active TSV structure) may be electrically coupled to the TSV structure T2 (the second active TSV structure) through the branch structure 602 (the first binary-tree structure) by applying an input test signal at the contact structure 636 and receiving an output test signal from the contact structure 638. As such, the TSV structures T1 and T2 can be tested based on comparing the input test signal with the output test signal. In some embodiments, the contact structure 636 is directly coupled to the TSV structure T1 (e.g., without other TSV structure coupled therebetween), and the contact structure 638 is directly coupled to the TSV structure T2 (e.g., without other TSV structure coupled therebetween).

The method 1500 proceeds to operation 1506 in which the first active TSV structure is electrically coupled to a third one of the active TSV structures through at least the first binary-tree structure, a second one of the binary-tree structures, and a third one of the binary-tree structures to test a fourth one of the active TSV structures and a fifth one of the active TSV structures. In some embodiments, after operation 1504 (e.g., performed multiple times), the TSV structures at the next upper level of the binary tree are tested. Still with the above example, the TSV structure T1 (the first active TSV structure) may be electrically coupled to the TSV structure T3 (the third active TSV structure) through the branch structure 602 (the first binary-tree structure), the branch structure 612 (the second binary-tree structure) and the branch structure 604 (the third binary-tree structure) by applying an input test signal at the contact structure 636 and receiving an output test signal from the contact structure 644. As such, the TSV structures T9 (the fourth active TSV structure) and T10 (the fifth active TSV structure) can be tested based on comparing the input test signal with the output test signal. In some embodiments, the contact structure 636 is indirectly coupled to the TSV structure T9 (e.g., with one or more other TSV structures coupled therebetween), and the contact structure 644 is indirectly coupled to the TSV structure T10 (e.g., with one or more other TSV structures coupled therebetween).

In one aspect of the present disclosure, a semiconductor package is disclosed. The semiconductor package includes an array of through-substrate-via (TSV) structures comprising a number (O) of TSV structures, wherein the array comprises a number (M) of active TSV structures; a number (N) of contact structures, the contact structures comprising a plurality of pairs configured to receive an input test signal and provide an output test signal, respectively; and a plurality of binary-tree branches, each of the plurality of binary-tree branches electrically coupling a first one of the active TSV structures to a second one of the active TSV structures and a third one of the active TSV structures.

In another aspect of the present disclosure, a semiconductor package is disclosed. The semiconductor package includes an array of through-substrate-via (TSV) structures comprising a plurality of active TSV structures; a plurality of first binary-tree branches; and a plurality of second binary-tree branches. The active TSV structures are electrically coupled to one another as a binary tree, in which each of the active TSV structures is electrically coupled to two other ones of the active TSV structures through a corresponding one of the first binary-tree structures or the second binary-tree structures.

In yet another aspect of the present disclosure, a method for testing connections of a semiconductor package is disclosed. The method includes providing a semiconductor package including a plurality of active TSV structures, wherein each of the active TSV structures is physically coupled to two other ones of the active TSV structures through a corresponding one of a plurality of binary-tree structures. The method includes electrically coupling a first one of the active TSV structures to a second one of the active TSV structures through at least a first one of the binary-tree structures to test the first active TSV structure and the second active TSV structure.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an array of through-substrate-via (TSV) structures comprising a number (O) of TSV structures, wherein the array comprises a number (M) of active TSV structures;
a number (N) of contact structures, the contact structures comprising a plurality of pairs configured to receive an input test signal and provide an output test signal, respectively; and
a plurality of binary-tree branches, each of the plurality of binary-tree branches electrically coupling a first one of the active TSV structures to a second one of the active TSV structures and a third one of the active TSV structures.

2. The semiconductor package of claim 1, wherein the array comprises a number (P) of dummy TSV structures.

3. The semiconductor package of claim 2, wherein M is equal to O–P, and N is equal to O/2.

4. The semiconductor package of claim 1, wherein a first one of the plurality of binary-tree branches connects its corresponding first active TSV structure to the second or third active TSV structure of a second one of the plurality of binary-tree branches.

5. The semiconductor package of claim 4, wherein at least respective root portions of the first subset of binary-tree branches and respective leaf portions of a second subset of the plurality of binary-tree branches are configured to be conducted to test the respective first active TSV structures of the first subset of binary-tree branches during one or more second tests.

6. The semiconductor package of claim 5, wherein at least respective root portions of the second subset of binary-tree branches are configured to be conducted to test the respective first active TSV structures of the second subset of binary-tree branches during one or more third tests.

7. The semiconductor package of claim 6, wherein a number of the one or more first tests corresponds to N/2, a number of the one or more second tests corresponds to N/4, and a number of the one or more second tests corresponds to N/8.

8. The semiconductor package of claim 1, wherein respective leaf portions of a first subset of the plurality of binary-tree branches are configured to be conducted to test the respective second and third active TSV structures of the first subset of binary-tree branches during one or more first tests.

9. A semiconductor package, comprising:
an array of through-substrate-via (TSV) structures comprising a plurality of active TSV structures;
a plurality of first binary-tree branches; and
a plurality of second binary-tree branches;
wherein the active TSV structures are electrically coupled to one another as a binary tree, in which each of the active TSV structures is electrically coupled to two other ones of the active TSV structures through a corresponding one of the first binary-tree structures or the second binary-tree structures.

10. The semiconductor package of claim 9, wherein the plurality of first binary-tree branches are disposed on a first side of the array of TSV structures, and the plurality of second binary-tree branches are disposed on a second, opposite side of the array of TSV structures.

11. The semiconductor package of claim 9, wherein the array comprises a fixed number of dummy TSV structures, each of the dummy TSV structures connected to none of the first or second binary-tree branches.

12. The semiconductor package of claim 9, wherein each of the plurality of first and second binary-tree branches is configured to electrically couple a first one of the active TSV structures to at least a second one of the active TSV structures or a third one of the active TSV structures.

13. The semiconductor package of claim 9, further comprising:
a plurality of contact structures;
wherein each of the plurality of contact structures is electrically coupled to a corresponding one of a subset of the active TSV structures, and configured to receive an input test signal and/or provide an output test signal.

14. The semiconductor package of claim 13, wherein the plurality of contact structures are directly connected to the respective ones of the subset of the active TSV structures, with none of the first or second binary-tree branches interposed therebetween.

15. The semiconductor package of claim 13, wherein the plurality of contact structures and the plurality of first binary-tree branches are disposed on a first side of the array of TSV structures, and the plurality of second binary-tree branches are disposed on a second, opposite side of the array of TSV structures.

16. The semiconductor package of claim 15, wherein the plurality of first binary-tree branches are spaced from one another with a first distance and the plurality of second binary-tree branches are spaced from one another with a second distance, and wherein the first distance is greater than the second distance.

17. A method for testing connections of a semiconductor package, comprising:
providing a semiconductor package including a plurality of active TSV structures, wherein each of the active TSV structures is physically coupled to two other ones of the active TSV structures through a corresponding one of a plurality of binary-tree structures; and
electrically coupling a first one of the active TSV structures to a second one of the active TSV structures through at least a first one of the binary-tree structures to test the first active TSV structure and the second active TSV structure.

18. The method of claim 17, further comprising:
electrically coupling the first active TSV structure to a third one of the active TSV structures through at least the first binary-tree structure, a second one of the binary-tree structures, and a third one of the binary-tree structures to test a fourth one of the active TSV structures and a fifth one of the active TSV structures.

19. The method of claim 18, wherein the first, second, and third active TSV structures are each directly coupled to a corresponding one of contact structures, and wherein the contact structures are each configured to receive an input test signal and/or provide an output test signal.

20. The method of claim 19, wherein the fourth and fifth active TSV structures are each indirectly coupled to a corresponding one of the contact structures through a corresponding one of the binary-tree structures.

* * * * *